United States Patent
Hoff et al.

(10) Patent No.: US 8,432,195 B2
(45) Date of Patent: Apr. 30, 2013

(54) LATCH CIRCUITS WITH SYNCHRONOUS DATA LOADING AND SELF-TIMED ASYNCHRONOUS DATA CAPTURE

(75) Inventors: David Paul Hoff, Cary, NC (US); Fadi Adel Hamdan, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 83 days.

(21) Appl. No.: 12/940,078

(22) Filed: Nov. 5, 2010

(65) Prior Publication Data

US 2012/0112813 A1 May 10, 2012

(51) Int. Cl.
*H03L 7/00* (2006.01)

(52) U.S. Cl.
USPC .......... 327/142; 327/143; 327/164; 365/233.1

(58) Field of Classification Search ............ 327/142, 327/143, 164; 365/233.1
See application file for complete search history.

(56) References Cited

U.S. PATENT DOCUMENTS

| | | | |
|---|---|---|---|
| 5,329,176 A | 7/1994 | Miller, Jr. et al. | |
| 5,546,355 A | 8/1996 | Raatz et al. | |
| 6,115,322 A | 9/2000 | Kanda et al. | |
| 6,212,092 B1 | 4/2001 | Shinozaki | |
| 6,703,879 B2 | 3/2004 | Okuda et al. | |
| 6,982,906 B2 | 1/2006 | Matsuoka et al. | |
| 7,113,446 B2 * | 9/2006 | Fujisawa | 365/189.15 |
| 7,170,325 B2 | 1/2007 | Lee | |
| 7,411,413 B2 | 8/2008 | Shimazaki et al. | |

FOREIGN PATENT DOCUMENTS

GB 2286272 A 8/1995

OTHER PUBLICATIONS

International Search Report and Written Opinion—PCT/US2011/059488—ISA/EPO—Jun. 4, 2012.

* cited by examiner

*Primary Examiner* — John Poos
(74) *Attorney, Agent, or Firm* — Nicholas J. Pauley; Peter Michael Kamarchik; Joseph Agusta

(57) ABSTRACT

A latch integrated circuit has synchronous data loading and self-timed asynchronous data capture characteristics. The integrated circuit may include a latch, a pulse generator and a comparator. The latch can be responsive to a data signal and a write enable signal. The pulse generator may be configured to generate the write enable signal as a pulse. This pulse may have a leading edge synchronized with a first edge of a clock signal and a self-timed trailing edge synchronized with an edge of a comparison signal. The comparator may be configured to generate the comparison signal in response to comparing logic levels of at least two nodes within the integrated circuit.

22 Claims, 5 Drawing Sheets

LATCH CIRCUITS WITH SYNCHRONOUS DATA LOADING AND SELF-TIMED ASYNCHRONOUS DATA CAPTURE

FIELD OF DISCLOSURE

The invention relates to integrated circuit devices and, more particularly, to latch integrated circuits that are operable in synchronous systems.

BACKGROUND

Conventional latch integrated circuits frequently utilize inverters coupled in antiparallel to provide a data latching operation. When utilized in synchronous integrated circuits, this latching operation may be synchronized with a timing signal, such as a clock signal (CLK). One example of a conventional latch integrated circuit includes a pulse latch, which utilizes a write enable pulse of sufficient "fixed" width to perform a write operation. Unfortunately, changes in performance of a pulse latch caused by changes in fabrication process, voltage and/or operating temperature (i.e., PVT changes) may cause fixed duration write operations to become unreliable by providing insufficient time for accurate loading of new data into the pulse latch. Examples of conventional latch integrated circuits are disclosed in U.S. Pat. No. 6,760,263 to Liou, entitled "Method and Device for Controlling Data Latch Time"; U.S. Pat. No. 6,115,322 to Kanda et al., entitled "Semiconductor Device Accepting Data Which Includes Serial Data Signals, in Synchronization with a Data Strobe Signal"; and U.S. Pat. No. 7,411,413 to Shimazaki et al., entitled "Pulse Latch Circuit and Semiconductor Integrated Circuit."

SUMMARY OF THE DISCLOSURE

Embodiments of the invention include latch integrated circuits having synchronous data loading and self-timed asynchronous data capture characteristics. According to some of these embodiments of the invention, an integrated circuit may include a latch, a pulse generator and a comparator. The latch can be responsive to a data signal and a write enable signal. The pulse generator may be configured to generate the write enable signal as a pulse. This pulse may have a leading edge synchronized with a first edge of a clock signal and a self-timed trailing edge synchronized with an edge of a comparison signal. The comparator may be configured to generate the comparison signal in response to comparing logic levels of at least two nodes within the latch integrated circuit.

According to additional embodiments of the invention, the latch may include first and second inverters, which are connected in antiparallel. The second inverter may have an input terminal responsive to an output of the first inverter and a control terminal responsive to the write enable signal. The latch may further include an input inverter, which is configured to generate an inverted data signal in response to the data signal. In addition, an embodiment of the comparator may include first, second and third input terminals, which are responsive to the data signal, the inverted data signal and the output of the first inverter, respectively.

According to further embodiments of the invention, the pulse generator may include a match detection circuit having a first node therein, which may be repeatedly precharged in-sync with the clock signal. In particular, this first node may be driven to a first logic level in response to a second edge of the clock signal. This first logic level may be a precharged voltage level (e.g., Vdd). In particular, the match detection circuit may be configured to switch the first node from the first logic level to a second logic level in response to detecting the edge of the comparison signal during an active phase of the write enable signal. This edge of the comparison signal may signify an accurate loading of new data into the latch. The pulse generator may also include a PMOS pull-up transistor, which has a drain terminal connected to an output of the match detection circuit and a gate terminal responsive to the clock signal, and an output inverter having an input electrically coupled to the output of the match detection circuit. This output inverter may be configured to generate the write enable signal.

According to alternative embodiments of the invention, the pulse generator may include a match detection circuit, which is configured to precharge a first node therein to a first logic level in response to a second edge of the clock signal and further configured to discharge the first node in response to detecting the edge of the comparison signal during an active phase of the write enable signal. The pulse generator may also include a discharge clamp having an input terminal and an output terminal, which are both electrically connected to the first node. According to some embodiments of the invention, the discharge clamp may include a feedback inverter having an input terminal connected to the first node.

According to still further embodiments of the invention, an integrated latch circuit may include a latch, which is responsive to data and a write enable signal, and a pulse generator. This pulse generator is configured to generate the write enable signal as a pulse. This pulse has a leading edge synchronized with a first edge of a clock signal and a self-timed trailing edge synchronized to a first signal that reflects an accurate loading of the data into said latch. This self-timed trailing edge can be synchronized to an edge of the first signal. The latch circuit may also include a comparator, which is configured to generate the first signal. This comparator may have a first input terminal configured to receive the data and a second input terminal configured to receive a signal generated at a latch node within the latch.

DETAILED DESCRIPTION

Figure 1:
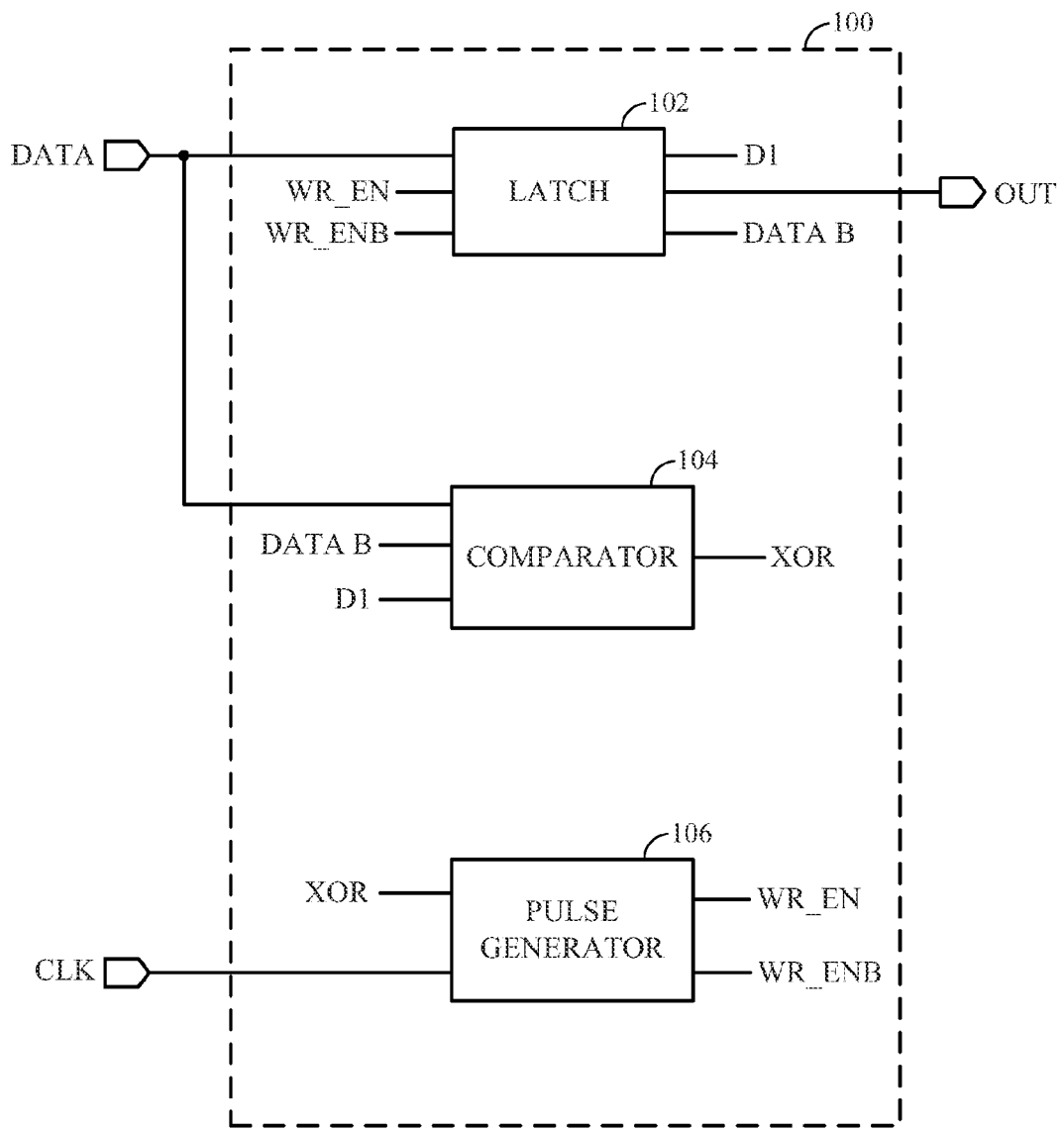
FIG. 1 is a block diagram of a latch integrated circuit according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Referring now to FIG. 1, a latch integrated circuit 100 according to an embodiment of the invention is illustrated as including a latch 102, a comparator 104 and a pulse generator 106, connected as illustrated. The latch 102 is configured to perform a latching operation on received data (DATA) and generate an output signal OUT, which can represent a complementary (or true) version of the received data (DATA). According to the illustrated embodiment, the latch 102 is responsive to a true write enable signal (WR_EN) and a complementary write enable signal (WR_ENB), which control the timing of the latching operation at nodes within the latch 102. The latch 102 also generates a signal D1, which reflects a voltage at a "latch" node within to the latch 102, and a complementary data signal DATAB, which is an inverted version of the received data (DATA). The comparator 104 performs a combinatorial logic function. In particular, the comparator 104 generates an exclusive-OR comparison signal (XOR) in response to a combination of the received data (DATA), the complementary data signal DATAB and the latch node signal D1. The pulse generator 106 generates the write enable signal (WR_EN) and its complement (WR_ENB) as respective pulses, in response to the exclusive-OR comparison signal (XOR) and a clock signal (CLK), which synchronizes operation of the latch integrated circuit 100.

As will now be described more fully hereinbelow with respect to FIGS. 2A-2D, the pulse generator 106 is configured to generate the write enable signal WR_EN as a pulse having a leading edge synchronized with a first edge (e.g., rising edge) of the clock signal CLK and a self-timed trailing edge synchronized with an edge (e.g., rising edge) of the exclusive-OR comparison signal (XOR). The comparator 104 is configured to generate this comparison signal (XOR) in response to comparing logic levels of at least two nodes within the latch.

Figure 2A:
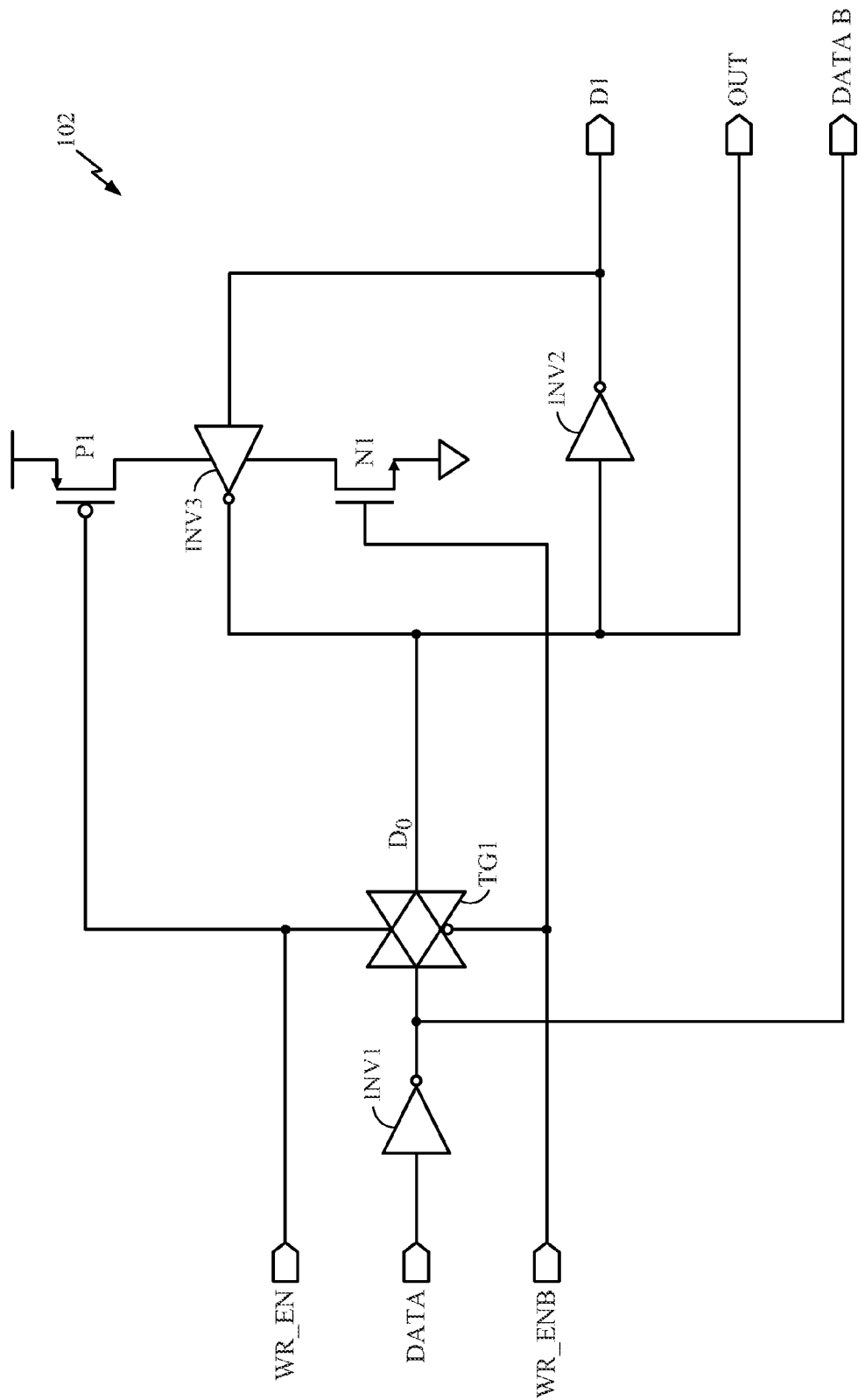
FIG. 2A is an electrical schematic of a latch, which may be utilized in the latch integrated circuit of FIG. 1.

FIG. 2A illustrates an embodiment of the latch 102 illustrated by FIG. 1, which includes an input inverter INV1, a transmission gate TG1, a pair of inverters INV2-INV3, which are connected in antiparallel, a PMOS pull-up control transistor P1 and an NMOS pull-down control transistor N1. The gate terminals of the control transistors P1 and N1 are responsive to the write enable signal WR_EN and the complementary write enable signal WR_ENB, respectively. Based on this configuration, the pair of inverters INV2-INV3 are enabled to perform a latching operation when the PMOS pull-up control transistor P1 and NMOS pull-down control transistor N1 are active in response to a logic 1 write enable signal WR_EN and a logic 0 complementary write enable signal WR_ENB. The inverter INV3, NMOS control transistor N1 and PMOS control transistor P1 may be treated collectively herein as an inverter device having at least one control terminal responsive to the write enable signal WR_EN.

A low-to-high transition of the write enable signal WR_EN also operates to turn on the transmission gate TG1 so that changes in the value of the data DATA can be reflected at the "latch" nodes D0 and D1 at the input/output terminals of the inverters INV2/INV3. In contrast, a high-to-low transition of the write enable signal WR_EN operates to turn off the transmission gate TG1 and blocks changes in a signal (i.e., DATAB) at an output of the input inverter INV1 from influencing the logic values of the "latch" nodes D0 and D1 within the latch 102.

Figure 2B:
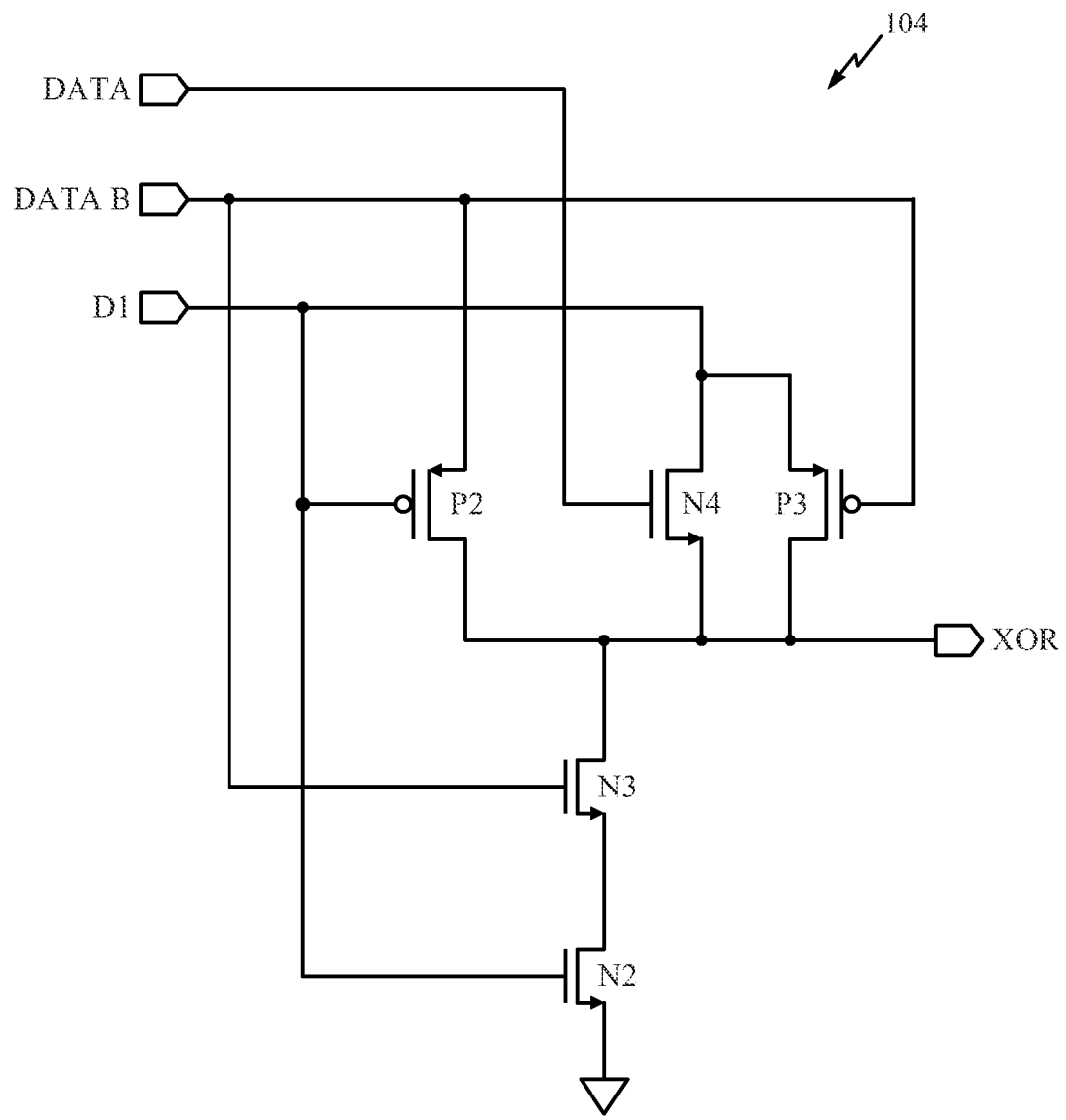
FIG. 2B is an electrical schematic of a comparator, which may be utilized in the latch integrated circuit of FIG. 1.

FIG. 2B illustrates an embodiment of a comparator 104, which generates an exclusive-OR comparison signal in accordance with the truth table of TABLE 1. The comparator 104 includes three NMOS transistors N2-N4 and two PMOS transistors P2-P3, which collectively generate an exclusive-OR "comparison" signal XOR. This comparison signal has a logic 1 value whenever a logic value of the received data (DATA) matches a logic value of the signal D1 at a latching node within the latch 102. Thus, the exclusive-OR comparison signal XOR will undergo a low-to-high transition whenever the signal D1 at a latch node within the latch 102 undergoes a low-to-high (or high-to-low) transition to match the value of the new data (DATA) received by the latch integrated circuit 100.

TABLE 1

| D1 | DATA | DATAB | XOR |
|---|---|---|---|
| 0 | 0 | 1 | 1 |
| 0 | 1 | 0 | 0 |
| 1 | 0 | 1 | 0 |
| 1 | 1 | 0 | 1 |

Figure 2C:
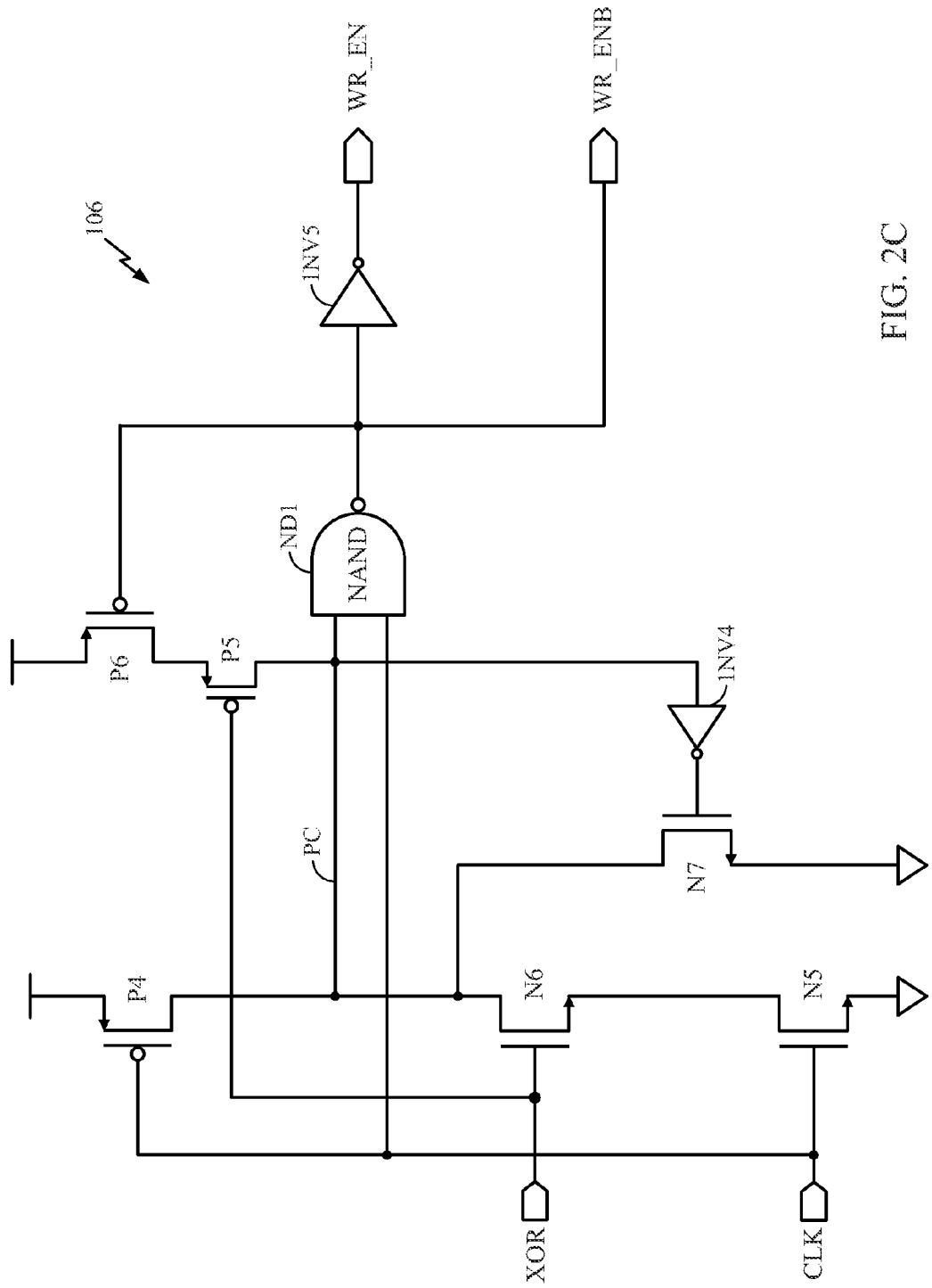
FIG. 2C is an electrical schematic of a pulse generator, which may be utilized in the latch integrated circuit of FIG. 1.

FIG. 2C illustrates an embodiment of the pulse generator 106 of FIG. 1. This pulse generator 106 is illustrated as including NMOS transistors N5-N7, PMOS transistors P4-P6, inverters INV4-INV5 and NAND gate ND1, connected as illustrated. As described more fully hereinbelow, some of the illustrated components of the pulse generator 106 may operate as a' match detection circuit and a discharge clamp.

Figure 2D:
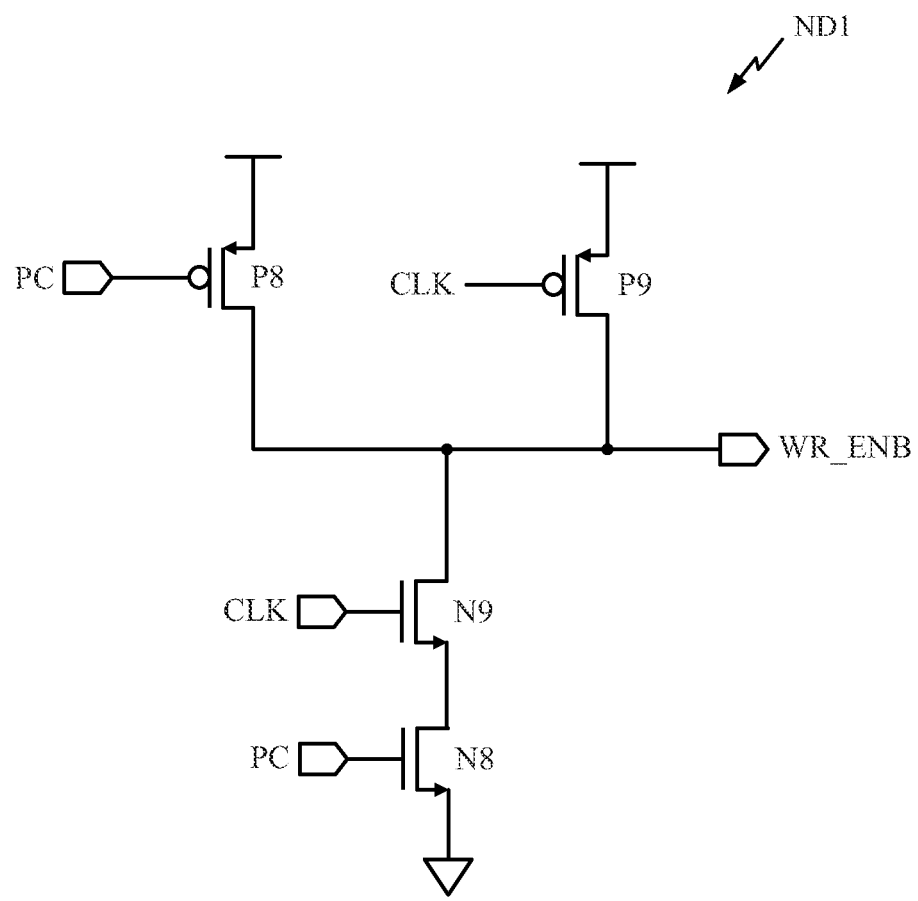
FIG. 2D is an electrical schematic of a two-input NAND gate, which may be utilized in the pulse generator of FIG. 2C.

Operation of the pulse generator 106 is synchronized with the clock signal CLK, which has an inactive phase (CLK=0) that disables write operations and an active phase (CLK=1) that enables operations to write new data into the latch 102. In particular, a high-to-low transition of the clock signal CLK will cause PMOS pull-up transistor P4 to turn on and pull-up a precharge node PC to a logic 1 value (or hold at a logic 1 level). The high-to-low transition of the clock signal CLK will also cause an output of the NAND gate ND1 to switch low-to-high (or remain high). Stated alternatively, a high-to-low transition of the clock signal CLK will cause the complementary write enable signal WR_ENB to switch low-to-high (or remain high at a logic 1 level) and cause the write enable signal WR_EN to switch high-to-low (or remain low at a logic 0 level). As illustrated by FIG. 2D, an embodiment of the NAND gate ND1 of FIG. 2C may include two PMOS pull-up transistors P8-P9 and two NMOS pull-down transistors N8-N9, connected as illustrated.

In contrast, a low-to-high transition of the clock signal CLK enables an operation to write new data into the latch 102 by causing the write enable signal WR_EN to switch low-to-high and the complementary write enable signal WR_ENB to switch high-to-low, to thereby turn on the transmission gate TG1 and electrically connect an output of the inverter INV1 to node D0 within the latch 102. In particular, the low-to-high transition of the clock signal CLK operates to turn on the NMOS pull-down transistor N5 and turn off the PMOS pull-up transistor P4. The low-to-high transition of the clock signal CLK in combination with a logic 1 level at the precharge node PC causes the output of the NAND gate ND1 to switch high-to-low. This high-to-low transition at the output of the NAND gate ND1 enables commencement of a write operation by causing the write enable signal WR_EN to switch low-to-high at the output of the inverter INV5 and causing the PMOS pull-up transistor P6 to turn on. Commencement of the write operation while the exclusive-OR comparison signal XOR remains at a logic 0 level will cause the NMOS pull-down transistor N6 to remain off and the PMOS pull-up transistor P5 to remain on (in combination with the PMOS pull-up transistor P6), to thereby hold the precharge node PC at a logic 1 level and maintain the write enable signal WR_EN at a logic 1 level.

During the time interval when the write enable signal WR_EN remains high at a logic 1 level, new data (DATA) can be written into the latch 102 to thereby switch the logic levels of the nodes D0 and D1. As illustrated by FIG. 2B and TABLE 1, an accurate loading of new data into the latch 102 will cause the logic level of the node D1 to match the new "write" data (DATA) and the exclusive-OR comparison signal XOR to switch low-to-high in an asynchronous manner based on a data comparison. As illustrated by FIG. 2C, a low-to-high transition/edge of the exclusive-OR comparison signal XOR will cause the NMOS transistor N6 to turn on and the PMOS transistor P5 to turn off. In response, the precharge node PC will be pulled from a logic 1 precharged level to a logic 0 discharged level by virtue of a conductive pull-down path provided by NMOS transistors N5-N6. This high-to-low switching of the precharge node PC operates in a self-timed manner to switch an output of the NAND gate ND1 from a logic 0 level to a logic 1 level to thereby terminate an active phase (e.g., logic 1 phase) of the write enable signal WR_EN and complete the write operation by turning off the transmission gate TG1 within the latch 102. The high-to-low switching of the precharge node PC also operates to turn on the NMOS pull-down transistor N7 by driving an input terminal of the inverter INV4 to a logic 0 level. In this manner, the components of the pulse generator 106 that collectively operate to discharge the precharge node PC in response to a low-to-high transition of the comparison signal XOR function as a match detection circuit. In addition, the "feedback" inverter INV4 and the NMOS pull-down transistor N7 operate as a discharge clamp by providing feedback to the precharge node PC. This feedback inhibits any noise at the precharge node PC from influencing an output of the NAND gate once the precharge node PC has been adequately discharged.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device, comprising:
a latch responsive to a data signal and a write enable signal;
a pulse generator configured to generate the write enable signal as a pulse having a leading edge synchronized with a first edge of a clock signal and a self-timed trailing edge synchronized with an edge of a comparison signal; and
a comparator configured to generate the comparison signal in response to comparing logic levels of at least two nodes within the integrated circuit device.

2. The device of claim 1, wherein said latch comprises first and second inverters connected in antiparallel; and wherein the second inverter has an input terminal responsive to an output of the first inverter and a control terminal responsive to the write enable signal.

3. The device of claim 2, wherein said latch comprises an input inverter configured to generate an inverted data signal in response to the data signal; and wherein said comparator has first, second and third input terminals responsive to the data signal, the inverted data signal and the output of the first inverter, respectively.

4. The device of claim 1, wherein said pulse generator comprises:
an output inverter having an input terminal responsive to an inverted write enable signal; and
a PMOS pull-transistor having a gate terminal responsive to the clock signal and a drain terminal connected to the input terminal of said output inverter.

5. The device of claim 1, wherein said pulse generator comprises a match detection circuit having a first node therein that is driven to a first logic level in response to a second edge of the clock signal.

6. The device of claim 5, wherein said match detection circuit is configured to switch the first node from the first logic level to a second logic level in response to detecting the edge of the comparison signal during an active phase of the write enable signal.

7. The device of claim 6, wherein said pulse generator further comprises a PMOS pull-up transistor having a drain terminal connected to an output of said match detection circuit and a gate terminal responsive to the clock signal.

8. The device of claim 7, wherein said pulse generator further comprises an output inverter having an input electrically coupled to the output of said match detection circuit.

9. The device of claim 8, wherein the output inverter is configured to generate the write enable signal.

10. The device of claim 1, wherein said pulse generator comprises:
a match detection circuit configured to precharge a first node therein to a first logic level in response to a second edge of the clock signal and further configured to discharge the first node in response to detecting the edge of the comparison signal during an active phase of the write enable signal.

11. The device of claim 10, wherein said pulse generator further comprises a discharge clamp having an input terminal and an output terminal electrically connected to the first node.

12. The device of claim 11, wherein the discharge clamp comprises a feedback inverter having an input terminal connected to the first node.

13. The device of claim 1, wherein said comparator is configured to generate the comparison signal in response to comparing logic levels of at least two nodes of said latch.

14. An integrated circuit device, comprising:
a latch responsive to data and a write enable signal; and
a pulse generator configured to generate the write enable signal as a pulse having a leading edge synchronized with a first edge of a clock signal and a self-timed trailing edge synchronized to a first signal that reflects an accurate loading of the data into said latch.

15. The device of claim 14, wherein the self-timed trailing edge is synchronized to an edge of the first signal.

16. The device of claim 15, further comprising a comparator configured to generate the first signal, said comparator having a first input terminal configured to receive the data.

17. The device of claim 16, wherein said comparator has a second input terminal configured to receive a signal at a latch node in said latch.

18. An integrated circuit device, comprising:
a latch responsive to data and a write enable signal; and
a pulse generator configured to generate the write enable signal as a pulse having a leading edge synchronized with a first edge of a clock signal and a trailing edge synchronized to a comparison of at least two nodes in the integrated circuit device.

19. The device of claim 18, wherein a timing of the trailing edge of the pulse is asynchronous relative to a timing of the clock signal.

20. The device of claim 19, wherein the trailing edge of the pulse is synchronized to a detection of a match between the data and an internal node of said latch having a voltage that reflects a match with the data.

21. A method for synchronous loading and self-timed asynchronous data capture, comprising:
receiving a data signal and a clock signal;

comparing logic levels of the data signal with a signal associated with a latch node to generate a comparison signal;

generating a write enable signal as a pulse having a leading edge synchronized with a first edge of the clock signal and a self-timed trailing edge synchronized with an edge of the comparison signal; and writing data into the latch in accordance with the data signal and the write enable signal.

22. An integrated circuit device, comprising:

means for receiving a data signal and a clock signal;

means for comparing logic levels of the data signal with a signal associated with a latch node to generate a comparison signal;

means for generating a write enable signal as a pulse having a leading edge synchronized with a first edge of the clock signal and a self-timed trailing edge synchronized with an edge of the comparison signal; and means for writing data into the latch in accordance with the data signal and the write enable signal.

\* \* \* \* \*